United States Patent
Onizuka et al.

(10) Patent No.: US 6,264,510 B1
(45) Date of Patent: Jul. 24, 2001

(54) LASER-WELDED BUS BAR STRUCTURE

(75) Inventors: Takahiro Onizuka; Atsuhiko Fujii; Yoshifumi Saka; Atsuhiro Togawa, all of Nagoya (JP)

(73) Assignees: Harness System Technologies Research Ltd., Nagoya; Sumitomo Wiring Systems, Ltd., Mie; Sumitomo Electric Industries, Ltd., Osaka, all of (JP)

( * ) Notice: Subject to any disclaimer, the term of this patent is extended or adjusted under 35 U.S.C. 154(b) by 0 days.

(21) Appl. No.: 09/084,397

(22) Filed: May 27, 1998

(30) Foreign Application Priority Data

May 28, 1997 (JP) .................................................. 9-138372
May 28, 1998 (JP) .................................................. 9-138369

(51) Int. Cl.[7] ..................................................... H01R 4/02
(52) U.S. Cl. ............................................. 439/876; 439/949
(58) Field of Search ........................... 439/76.2, 78, 876, 439/949, 34; 361/749

(56) References Cited

U.S. PATENT DOCUMENTS

| 4,818,236 | * | 4/1989 | Nakayama et al. .................... 439/34 |
| 4,907,991 | * | 3/1990 | Kobayashi et al. .................... 439/876 |
| 4,972,295 | * | 11/1990 | Suguro et al. ........................ 361/386 |
| 5,444,295 | * | 8/1995 | Lake et al. ............................ 257/678 |
| 5,530,625 | * | 6/1996 | VanDerStuyf et al. .............. 361/749 |
| 5,541,365 | | 7/1996 | Sugiura et al. . |
| 5,807,124 | * | 9/1998 | Bricaud et al. ....................... 439/188 |
| 5,902,138 | * | 5/1999 | Murakami ............................ 439/76.2 |

FOREIGN PATENT DOCUMENTS

| 295 05 107 U | 5/1995 | (DE) . |
| 2-103876 | 4/1990 | (JP) . |
| 3-150014 | 6/1991 | (JP) . |
| 5-174940 | 7/1993 | (JP) . |
| 6-302341 | 10/1994 | (JP) . |
| 7-245130 | 9/1995 | (JP) . |

* cited by examiner

Primary Examiner—Neil Abrams
Assistant Examiner—J. F. Duverne
(74) Attorney, Agent, or Firm—Oliff & Berridge, PLC

(57) ABSTRACT

A bus bar structure includes: a bus bar stored in an electric junction box; and a tab terminal electrically connected to a pattern portion of the bus bar. The tab terminal is separately formed with the bus bar. The pattern portion is welded with the tab terminal by using a laser beam.

5 Claims, 8 Drawing Sheets

LASER-WELDED BUS BAR STRUCTURE

BACKGROUND OF THE INVENTION

1. Field of the Invention

The present invention relates to a bus bar structure stored in an electric junction box which laser welding is optionally used.

2. Description of the Related Art

Conventionally, the following welding technique has been proposed (see Japanese Unexamined Patent Application No. 2-103876 opened in 1990). That is, as indicated in FIG. 13A, a laser beam LB is irradiated onto a crimp-style portion 3a of a crimp-style terminal 3 for crimping/connecting a conductor 2 of an electric wire (electric cable) 1, and thus both the crimp-style portion 3a and the conductor 2 are melted to thereby be welded with each other.

Another conventional welding structure has been proposed (see Japanese Unexamined Patent Application No. 6-302341 opened in 1994). As illustrated in FIG. 13B, a metal projection portion 5 used to fill a melting volume is separately provided with a plate-shaped welding metal conductor portion 4, a conductor 2 constituted by a plurality of base lines 2a is arranged under this projection portion 5, and then a laser beam LB is irradiated onto the projection portion 5, so that the projection portion 5 is melt with the conductor 2 to thereby be welded with each other.

On the other hand, an electric junction box used to branch/connect an automobile wire harness and the like to various electric equipments is employed so as to concentrate branch connection points to a single point, so that electric wires, or cables are branched/connected to each other in view of rational and economical aspects. Since wire harnesses are made in higher density, various types of wire harnesses have been developed, depending upon sorts of automobiles, or utilizations in automobiles.

As the above-described electric junction box, as represented in FIG. 12, the following electric junction box has been proposed. That is, bus bars 7A to 7C are stamped from a hoop member 6, respectively, by using a press die, or a press metal mold. Tab terminals 7a and 7b are cut out from pattern portions of the respective bus bars 7A to 7C to be raised. Also, electric insulating plates 8A to 8C are interposed between the respective bus bars 7A to 7C so as to be stacked. The stacked members are stored into an upper case 9A and a lower case 9B of the electric junction box 9.

The tab terminal 7a cut/raised along the upper direction from the bus bar 7B located at the middle layer among the above-explained respective bus bars 7A to 7C is set in such a manner that this tab terminal 7a penetrates the insulating plate 8A of the upper layer, and the height of this penetrating tab terminal 7a is made equal to that of the tab terminal 7a which is cut/raised along the upper direction from the bus bar 7A of the upper layer, as shown in FIG. 11 in detail. Furthermore, the tab terminal 7a cut/raised along the upper direction from the bus bar 7C located at the lower layer is set in such a manner that this tab terminal 7a penetrates both the insulating plate 8B of the middle layer and the insulating plate 8A of the upper layer, and the height of this penetrating tab terminal 7a is made equal to that of the tab terminal 7a which is cut/raised along the upper direction from the bus bar 7A of the upper layer.

Similarly, the tab terminal 7b cut/raised along the lower direction from the bus bar 7B located at the middle layer is set in such a manner that this tab terminal 7b penetrates the insulating plate 8C of the lower layer, and the height of this penetrating tab terminal 7b is made equal to that of the tab terminal 7b which is cut/raised along the lower direction from the bus bar 7C of the lower layer. The tab terminal 7b cut/raised along the lower direction from the bus bar 7A located at the upper layer is set in such a manner that this tab terminal 7b penetrates both the insulating plate 8B of the middle layer and the insulating plate 8C of the lower layer, and the height of this penetrating tab terminal 7b is made equal to that of the tab terminal 7b which is cut/raised along the lower direction from the bus bar 7C of the lower layer.

Then, as shown in FIG. 12, a fuse 11 and a relay 12, which constitute external parts, are inserted via a junction terminal 10 and the like, and connected to the respective tab terminals 7a and 7b. Also, a connector externally provided on an integration side is directly inserted and connected to these tab terminals 7a and 7b.

In such a case that a circuit volume installed in the electric junction terminal box 9 is increased, the pattern portions located close to the bus bar 7A (7B, 7C) in the same layer may be connected to each other by way of connectors, the pattern portions of the bus bars 7A to 7C in the different layers may be connected with each other by using connectors, and furthermore, other electric distributing materials (namely, conductors such as FPC, PCB, and electric cable) may be connected to the pattern portions of the bus bars 7A to 7C by employing connectors.

On the other hand, very recently, the below-mentioned trial has been made. That is, a plurality of electric junction boxes mounted inside an automobile in a distribution manner are intensively collected to constitute a single electric junction box, and this single electric junction box is arranged in a center cluster and the like. As a consequence, a total number of wire harnesses used to connect the respective electric junction boxes with each other is reduced, or simplified.

In the case that a total quantity of circuits provided in the above-described electric junction boxes is on the order of 40, the above-explained bus bar stacked layer structure made of the three layers may be employed. However, if a total number of circuits employed in the electric junction boxes is increased up to 80 to 100 approximately by way of the above-described intensive collection of these electric junction boxes, then a bus bar stacked layer structure made of 8 to 10 layers is constructed.

When such a bus bar stacked layer structure made of 8 to 10 layers is constructed, the lengths of the tab terminals must be made longer than those of the above tab terminals, by which these long tab terminals may penetrate 8 to 10 layers of the insulating plates at maximum. That is, when the tab terminals are cut/raised along the upper/lower directions from the pattern portions of the bus bars of the respective layers, the tab terminal cut/raised from the bus bar of the uppermost layer along the upper direction must be set in such a manner that the height of this tab terminal is made equal to that of the tab terminal cut/raised from the bus bar of the lowermost layer along the upper direction.

However, in order that the long tab terminals are cut/raised from the pattern portions of the bus bars, since spaces used to cut/raise these long tab terminals are required in the pattern portions, these spaces will constitute a so-called "dead space". Accordingly, since the resultant bus bars cannot be made compact, but also in high density, there is a problem that a total number of bus bar stacked layers cannot be lowered.

SUMMARY OF THE INVENTION

The present invention has been made to solve the above-described problem, and therefore, has an object to provide a bus bar structure, capable of making a compact bus bar in high density, which is stored in an electric junction box, while utilizing a laser welding technique.

To solve the above-explained problem, there is provided for a bus bar structure including: a bus bar stored in an electric junction box; and a tab terminal electrically connected to a pattern portion of the bus bar, the tab terminal being separately formed with the bus bar, wherein the pattern portion is welded with the tab terminal by using a laser beam.

Furthere, a bus bar structure may include: a bus bar stored in an electric junction box, the bus bar defining a first and second pattern portions; and a jumper disposed astride the first and second pattern portions and electrically connecting between the first and second pattern portions, and the jumper is welded with each of the pattern portions by using a laser beam.

In addition, a bus bar structure may include: a bus bar stored in an electric junction box; and a conductor of at least one of FPC, PCB, and an electric wire electrically connecting to a pattern portion of the bus bar; and the conductor is welded with the pattern portion by using a laser beam.

Moreover, a bus bar structure may include: a bus bar stored in an electric junction box, the bus bar having a first hole; a connected body electrically connected to the bus bar, the connected body having a second hole; and a board arranging the bus bar and made of an insulating material, the board having a boss portion fitted to the first and second holes so as to position the bus bar and the connected body. A tip portion of the boss portion is deformed so as to fix the bus bar and the connected body, after fitting the boss portion to the first and second holes, and the bus bar and the connected body positioned to each other are welded by using a laser beam.

BRIEF DESCRIPTION OF THE DRAWINGS

Similar reference characters denote corresponding features consistently throughout the attached drawings. The preferred embodiments of this invention will be described in detail, with reference to the following figures, wherein:

FIG. 1A is a perspective view for showing such a bus bar structure that a tab terminal is welded with a bus bar by way of a laser beam; and FIG. 1B is a cross-sectional view of this bus bar structure;

FIG. 6A is an exploded perspective view for showing such a bus bar structure manufactured before a tab terminal is welded with a bus bar by way of a laser beam; and FIG. 6B is a cross-sectional view of this bus bar structure in which the tab terminal is welded with bus bar by using the laser beam;

DETAILED DESCRIPTION OF THE PREFERRED EMBODIMENTS

Figure 1A:
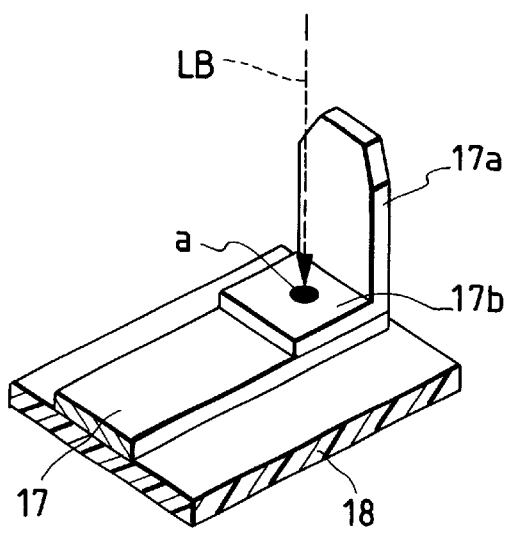
FIGS. 1A and 1B are a bus bar structure according to a first embodiment mode of the present invention.

Referring now to drawings, various embodiment modes according to the present invention will be described in detail. It should be noted that the same reference numerals used to explain the structures and effects of the prior art structures will be employed as those for denoting the same or similar structures/effects, and detailed explanations thereof are omitted.

Figure 1B:
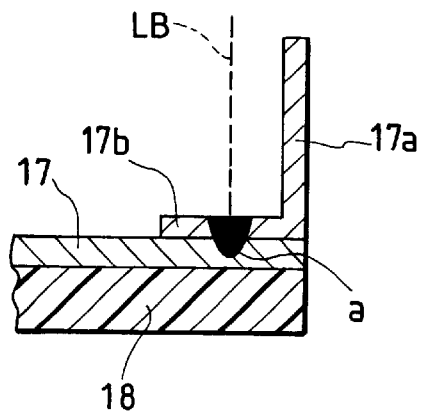
Figure 2:
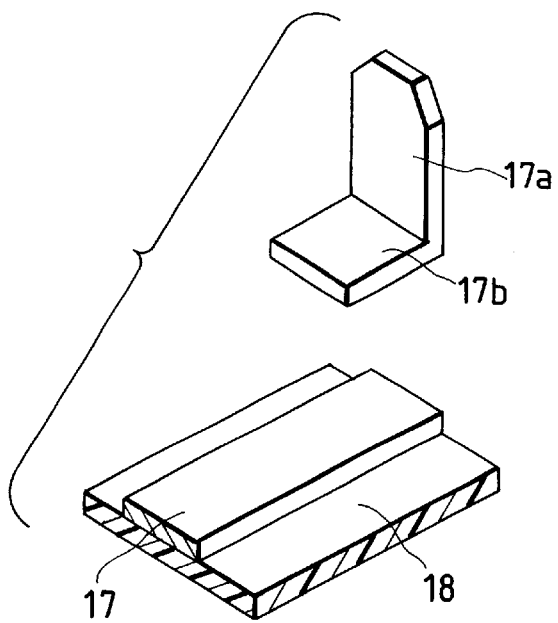
FIG. 2 is an exploded perspective view for indicating such a structure manufactured before the tab terminal is welded with the bus bar by way of the laser beam.

FIGS. 1A to 2 illustrate a bus bar structure according to a first embodiment mode of the present invention. At indicated in FIG. 2, while a tab terminal 17a is separately provided, a bent leg portion 17b is formed on a lower end of the tab terminal 17a in an integral body, which is different from the conventional bus bar structure in which the tab terminals 17a are cut/raised from the pattern portions of the bus bar 17 along the upper/lower directions.

Then, as shown in FIGS. 1A and 1B, while the bent leg portion 17b of the tab terminal 17a upwardly abuts against the pattern portion of the bus bar 17 on an insulating plate 18, a laser beam LB is irradiated onto a center position of the bent leg portion 17b along a right upper direction.

Both the bent leg portion 17b and the pattern portion of the bus bar 17 are melted by this laser beam irradiation under such a condition that the tab terminal 17a is upwardly directed, and thereafter these bent leg portion 17b and pattern portion of the bus bar 17 are welded with each other.

Also, while the bent leg portion 17b of the tab terminal 17a downwardly abuts against the pattern portion of the bus bar 17, a laser beam LB is irradiated onto the center position of the bent leg portion 17b along a right lower direction. Both the bent leg portion 17b and the pattern portion of the bus bar 17 are melted by this laser beam irradiation under such a condition that the tab terminal 17a is downwardly directed, and thereafter these bent leg portion 17b and pattern portion of the bus bar 17 are welded with each other.

As explained above, when the laser beam LB is irradiated onto the center position of the bent leg portion 17b, since the surface area of this bent leg portion 17b is widened, an allowable range for a precision error of the irradiation position is also widened. Also, since the laser beam LB is irradiated along either the right upper direction or the right lower direction, the beam irradiation distance can be minimized while there is less disturbance. Furthermore, since the laser beams LB may be easily irradiated onto a plurality of welding portions along the same direction at the same time, this bus bar structure may be manufactured by way of the quantity production manner.

It should be noted that the laser beam may be irradiated onto a boundary surface of joints between the bus bar 17 and the bent leg portion 17b of the tab terminal 17a along either an inclined direction or a traverse direction so as to be welded with each other except for such an irradiation condition that the laser beam LB is irradiated along either the right upper direction or the right lower direction.

Alternatively, all of the tab terminals 17c of the above-described bus bar 17 are not separately welded with the pattern portions of the bus bars 17. The tab terminals 17a may be cut/raised from the pattern portions of the bus bar 17 along the upper/lower directions in a similar manner to the conventional bus bar structure in combination with the above-explained bus bar structure, if required.

Figure 3:
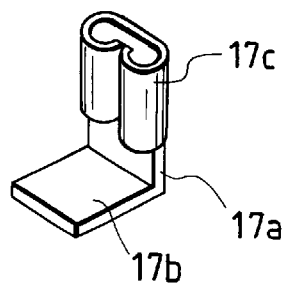
FIG. 3 is a perspective view for indicating a tab terminal to which a junction terminal is formed in an integral form.

As indicated in FIG. 3, when a junction terminal 17c is formed on the above-explained tab terminal 17a in an integral form, the separately provided junction terminal is no longer required.

When the above-described bus bar 17 is welded, if the conventional resistance welding is employed, then large jigs are required so as to sandwich this bus bar 17 by electrodes with respect to each of these bus bars 17. As a result, a total number of processing stages is increased, and the high cost machine facilities are required, so that this resistance welding is not properly applied to the quantity production. Also, when the above-described bus bar 17 is welded by way of the conventional arc welding, since the interpole space between the bus bar and other circuits is narrow, either the insulation is required, or the interpole space must be widened. Thus, the bus bars cannot be made in high density, but also the respective circuits to be welded must be separately grounded. As a result, a total number of processing stages is increased, and the high cost machine facilities are required, so that this arc welding is not properly applied to the quantity production. Furthermore, when the above-described bus bar 17 is welded by way of the ultrasonic welding, since a plated portion of this bus bar cannot be welded, this bus bar must be partially plated, and furthermore, since the respective bus bars own different shapes from each other, a plurality of jigs are required, the total quantity of which is equal to that of the circuits. As a result, a total number of processing stages is increased, and the high cost machine facilities are required, so that this ultrasonic welding is not properly applied to the quantity production.

To the contrary, in the case of the laser welding according to the present invention, since the laser beam LB is the non-contact type welding method, the bus bar 17 can be firmly welded only with a simple jig, and furthermore, since the welding time in seconds required for one welding place is short, this laser welding can be preferably manufactured by way of the quantity production, as compared with the above-explained resistance welding, arc welding, and ultrasonic welding. Also, since the laser beam LB has a narrow beam diameter, the bus bars 17 and the tab terminals 17a can be made in narrow pitches. As a consequence, there is a merit that the degree of design in the electric wiring can be improved.

Among various sorts of laser welding methods, a YAG laser welding method is selectable as an optimum laser welding method, because of the following reasons. That is, this YAG laser welding method is the non-contact welding method, and owns less terminal influence layers; A YAG laser welding apparatus can be made compact with low power consumption. Since an optical fiber can be used with this YAG laser welding apparatus, a three-dimensional welding manner may be readily realized. Moreover, a laser beam of this YAG laser welding apparatus can be subdivided into multi-laser beams by which multi-points can be simultaneously welded. As a consequence, since the automatic YAG laser welding system can be easily established, an production cost can be considerably reduced.

Figure 4:
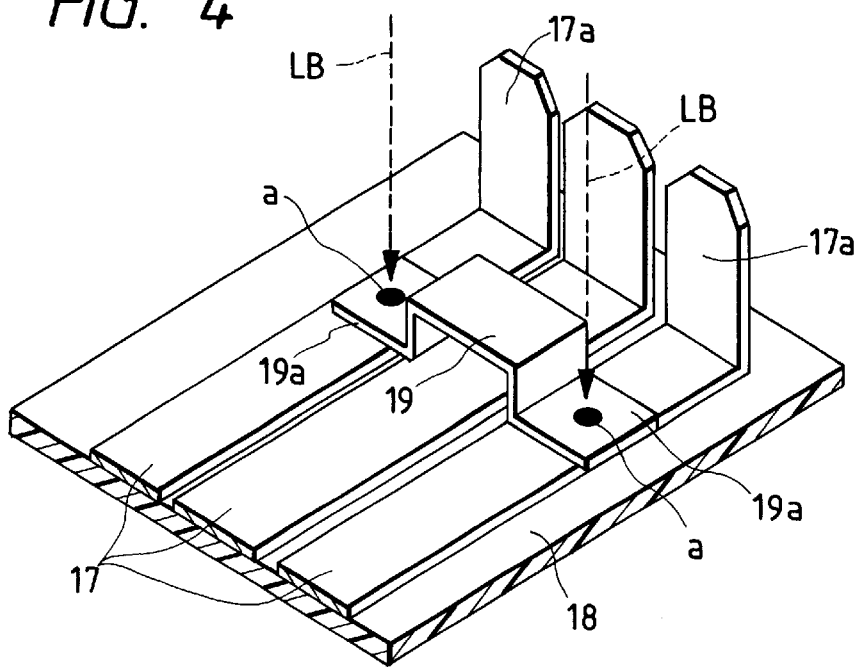
FIG. 4 is a perspective view for representing a bus bar structure according to a second embodiment of the present invention, in which a jumper is welded to a bus bar by using a laser beam.

FIG. 4 shows a bus bar structure according to a second embodiment mode of the present invention. While bent leg portions 19a and 19a of a jumper 19 bent in a shape of substantially "Ω" upwardly abut against pattern portions of bus bars 17 on an insulating plate 18 in such a manner that these bent leg portions 19a and 19a sit astride these pattern portions of the bus bars 17, laser beams LB are irradiated onto center positions of the respective bent leg portions 19a and 19a from a just upper direction. It should be understood that in this second embodiment mode, tab terminals 17a are cut/raised from the pattern portions of the bus bars 17 along the upper/lower directions similar to the conventional bus bar structure.

Since the laser beams LB are irradiated, the respective bent leg portions 19a, 19a, and the pattern portions of the bus bars 17 are melt to be welded with each other (symbol "a" of FIG. 4).

In accordance with this laser welding, since the pattern portions of the bus bar 17 are no longer connected by using the connectors, as executed in the conventional bus bar structure, both space saving and cost saving can be realized.

Figure 5:
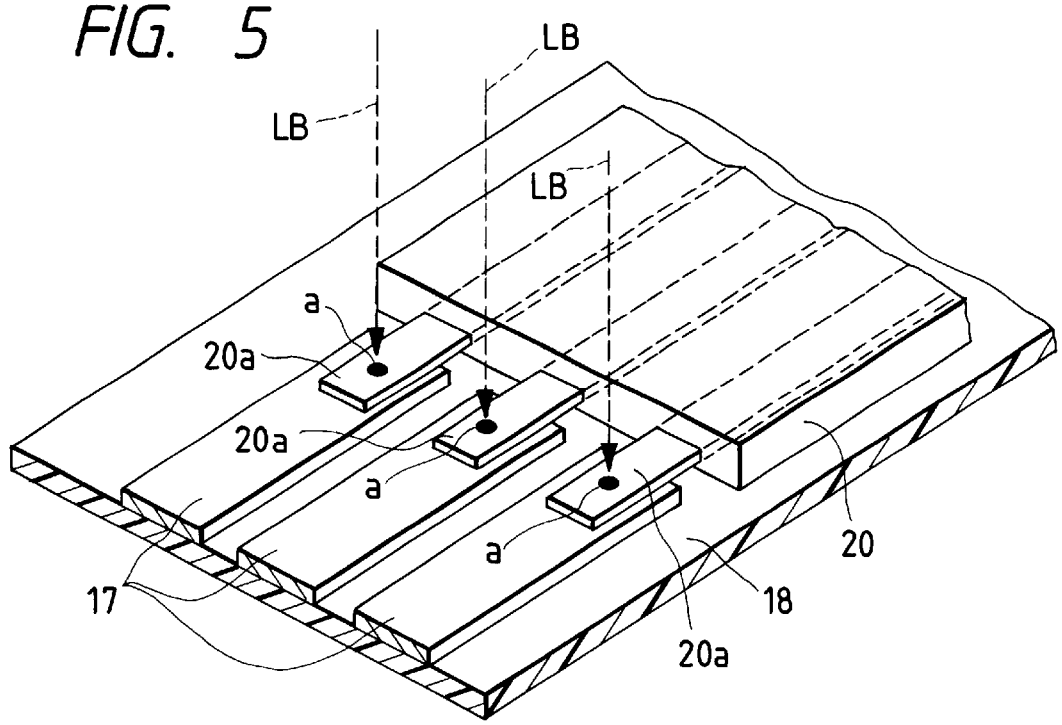
FIG. 5 is a perspective view for representing a bus bar structure according to a third embodiment of the present invention, in which a conductor such as FPC is welded to a bus bar by using a laser.

FIG. 5 indicates a bus bar structure according to a third embodiment mode of the present invention. While conductors 20a, - - - , 20a such as FPC (Flexible Printed Circuit), PCB (Printed Circuit Board), or electric wires upwardly abut against the pattern portions of the bus bars 17 on the insulating plate 18, laser beams LB are irradiated onto center positions of the respective conductors 20a, - - - , 20a from a just upper direction.

Since the laser beams LB are irradiated, the respective conductors 20a, - - - ,20a, and the pattern portions of the bus bars 17 are melt to be welded with each other (symbol "a" of FIG. 5).

In accordance with this laser welding, since the pattern portions of the bus bar 17 are no longer connected to the conductors 20a such as FPC by using the connectors, as executed in the conventional bus bar structure, both space saving and cost saving can be realized.

Figure 6A:
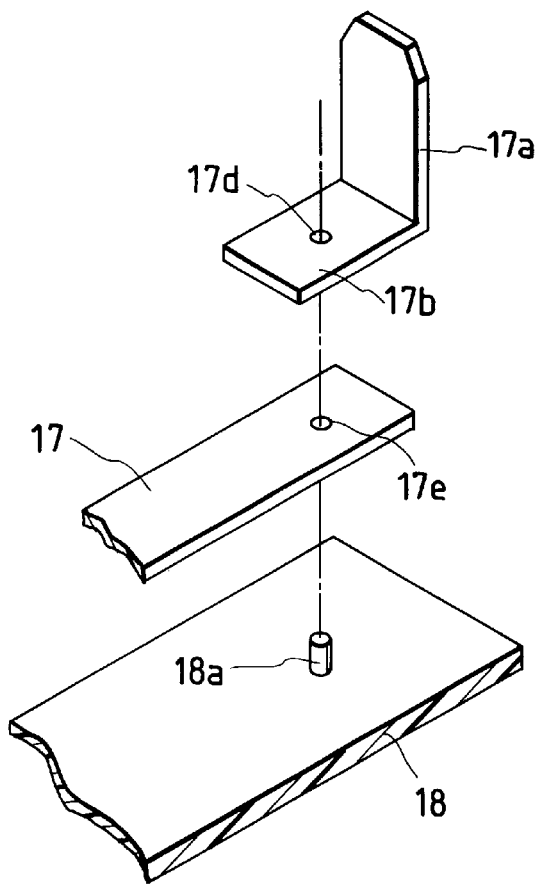
FIGS. 6A and 6B are a bus bar structure according to a fourth embodiment mode of the present invention.
Figure 6B:
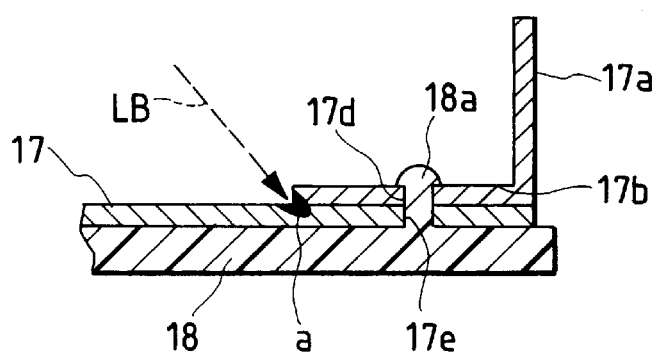

FIGS. 6A and 6B illustrate a bus bar structure according to a fourth embodiment mode of the present invention. As indicated in FIGS. 6A and 6B, while a tab terminal 17a is separately provided, a bent leg portion 17b is formed on a lower end of the tab terminal 17a in an integral body, which is different from the conventional bus bar structure in which the tab terminals 17a are cut/raised from the pattern portions of the bus bar 17 along the upper/lower directions. A positioning hole 17d is formed in this bent leg portion 17b.

A boss portion 18a is formed in an integral manner on an insulating plate 18 made of synthetic resin, for arranging thereon the bus bar 17. A fixing hole 17e formed in the pattern portion of the bus bar 17 is fitted with this boss portion 18a. A length of this boss portion 18a is set in such a manner that when the bent leg portion 17b of the tab terminal 17a upwardly abuts against the pattern portion of the bus bar 17 on the insulating plate 18, this boss portion 18a is also fitted to the positioning hole 17d of the bent leg portion 17b, and then is slightly projected toward the upper direction.

Figure 7:
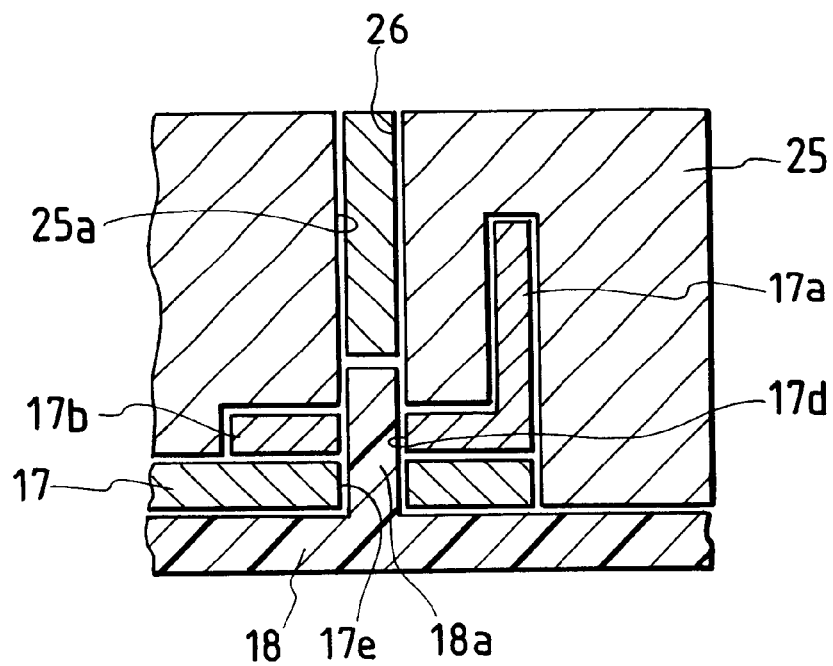
FIG. 7 is a cross-sectional view for indicating such a structure manufactured in which a boss portion of an insulating plate is crushed by a mold.

Then, an indicated in FIG. 7, under such a condition that both the pattern portion of the bus bar 17 and the bent leg portion 17b of the tab terminal 17a are depressed against the insulating plate 18 by way of a mold 25, when a crushing shaft 26 is inserted into an insertion hole 25a of the mold 25, and a tip portion of the boss portion 18a is mechanically crushed as shown in FIG. 6B, the bus bar is fixed on the insulating plate 18. At the same time, the tab terminal 17a is positioned with respect to the bus bar 17.

In addition, the tip portion of the boss portion 18a may be deformed as shown in FIG. 6B, by not only mechanically crushing, but also melting.

Thereafter, as shown in FIG. 6B, a laser beam LB is irradiated onto a joint boundary plane between a rear edge surface of the bent leg portion 17b of the tab terminal 17a and an upper surface of the bus bar 17 along an upper oblique direction.

As a result of this laser irradiation, both the bent leg portion 17b of the tab terminal 17a and the pattern portion of the bus bar 17 are melted to be welded with each other (symbol "a" of FIG. 6B) under such a condition that the bent leg portion 17b is positioned with respect to the pattern portion of the bus bar 17 in high precision.

Alternatively, all of the tab terminals 17c of the above-described bus bar 17 are not separately welded with the pattern portions of the bus bars 17. The tab terminals 17a may be cut/raised from the pattern portions of the bus bar 17 along the upper/lower directions in a similar manner to the conventional bus bar structure in combination with the above-explained welding structure, if required.

Figure 8:
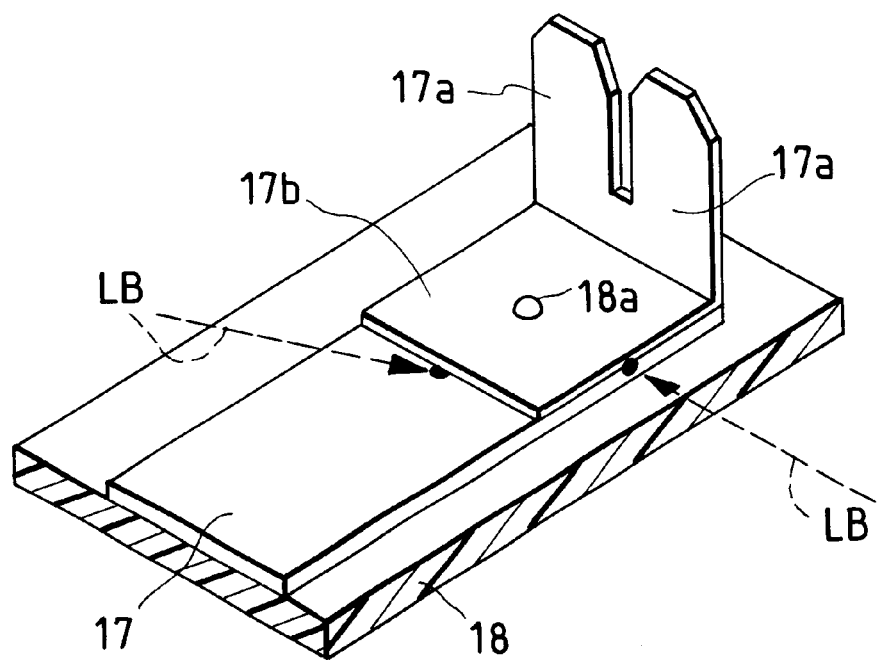
FIG. 8 is a perspective view for indicating such a structure that a modified tab terminal is melded with the bus bar by using a laser beam.

Also, as indicated in FIG. 8, while both the width of the pattern portion of the bus bar 17 and the width of the tab terminal 17a are widened, a plurality of tab terminals 17a and 17a may be formed in an internal form.

Further, similar to the first embodiment, when a junction terminal 17c can be formed on the above-explained tab terminal 17a in an integral form, as indicated in FIG. 3.

Figure 9:
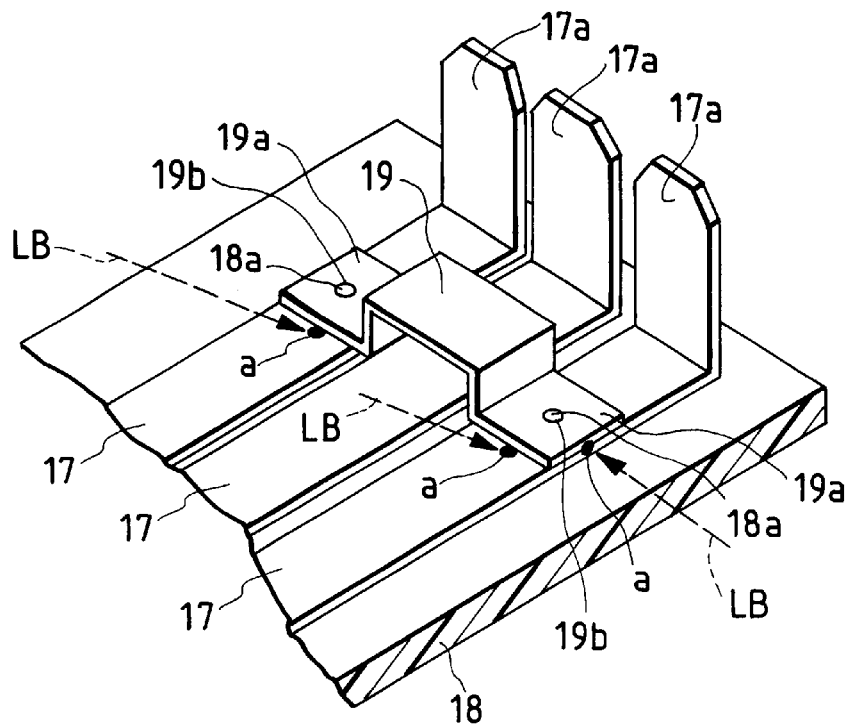
FIG. 9 is a perspective view for representing a bus bar structure according to a fifth embodiment of the present invention, in which a jumper is welded to a bus bar by using a laser beam.

FIG. 9 shows a bus bar structure according to a fifth embodiment mode of the present invention. While a jumper 19 bent in a shape of substantially "Ω" is provided in such a manner that the jumper 19 sits astride these pattern portions of the bus bars 17 on the insulating plate 18, positioning holes 19b and 19b are formed in the bent leg portions 19a and 19a of this jumper 19.

Boss portions 18a and 18a are formed in an integral manner on the insulating plate 18 made of synthetic resin, for arranging thereon the bus bar 17. Fixing holes 19b and 19b formed in the folded leg portions 19a and 19a of the jumper 19 are fitted with the boss portions 18a and 18a. A length of this boss portion 18a is set in such a manner that when the folded leg portions 19a and 19a of the jumper 19 upwardly abut against the pattern portion of the bus bar 17 on the insulating plate 18, this boss portion 18a is also fitted to the positioning holes 19b and 19b of the folded leg portions 19a and 19a, and then is slightly projected toward the upper direction.

Then, similar to these as indicated in FIG. 7, under such a condition that both the pattern portion of the bus bar 17 and the bent leg portions 19a and 19a of the jumper 19 are depressed against the insulating plate 18 by way of a mold 25, when a crushing shaft 26 is inserted into an insertion hole 25a of the mold 25, and a tip portion of the boss portion 18a is mechanically crushed, the bus bar is fixed on the insulating plate 18. At the same time, the jumper 19 is positioned with respect to the bus bar 17.

Thereafter, a laser beam LB is irradiated onto a joint boundary plane between edge surfaces of the bent leg portions 19a and 19a of the jumper 19 and an upper surface of the bus bar 17 along an upper oblique direction. Alternatively, the laser beam LB may be irradiated onto another joint boundary plane between the edge surfaces of the bent leg portions 19a and 19a of the jumper 19, and also the edge surface of the bus bar 17 along the just transverse direction.

With this laser irradiation, both the folded leg portions 19a and 19a of the jumper 19, and also the pattern of the bus bar 17 are melted to be welded with each other, indicated by symbol "a", under such a condition that these folded leg portions 19a and 19a are positioned with respect to the pattern portion of the bus bar 17.

In accordance with this laser welding, since the pattern portions of the bus bar 17 are no longer connected by using the connectors, as executed in the conventional bus bar structure, both space saving and cost saving can be realized.

Figure 10:
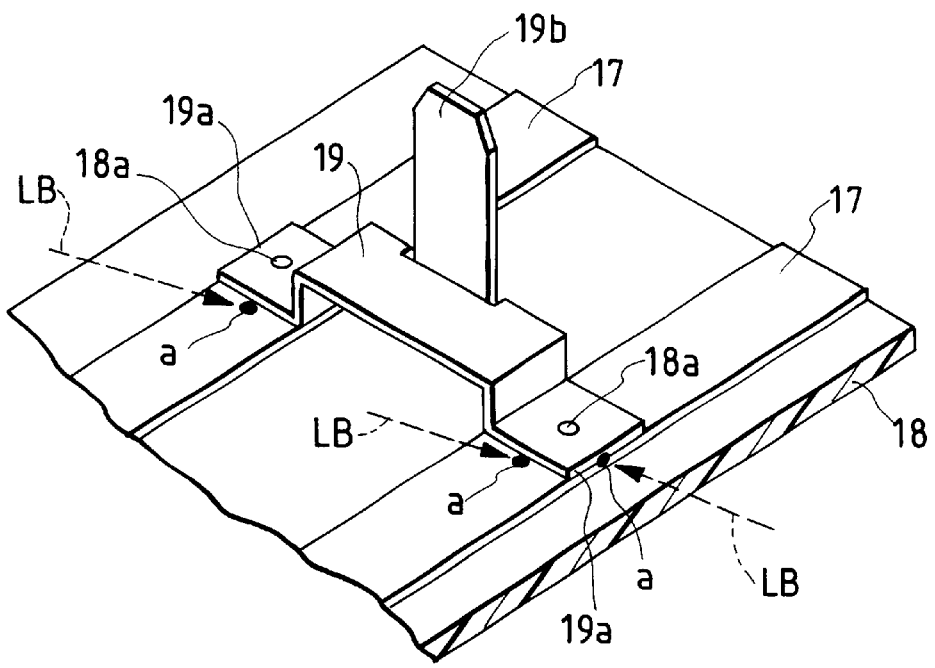
FIG. 10 is a perspective view for representing a bus bar structure in which a modified jumper is welded to a bus bar by using a laser beam.
Figure 11:
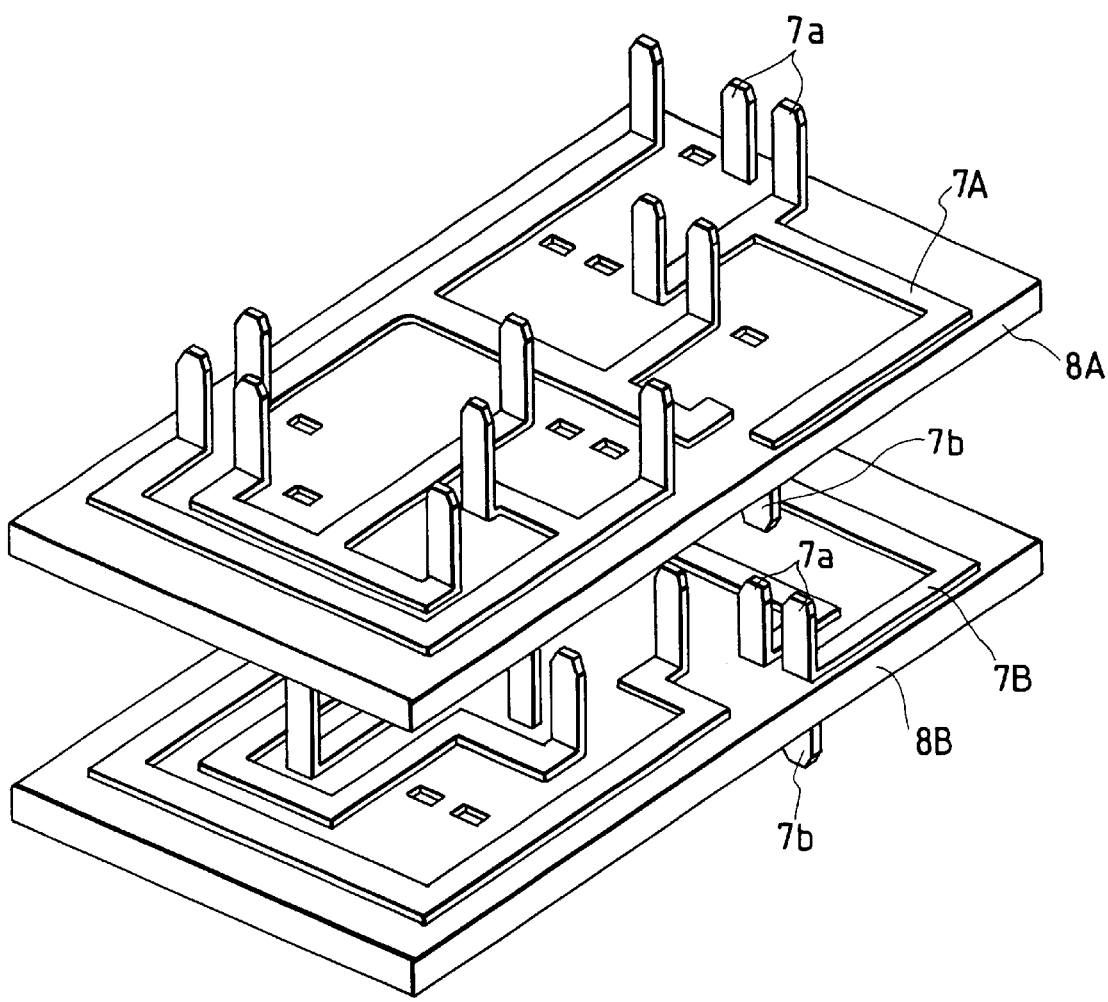
FIG. 11 is a perspective view for representing the conventional bus bar.
Figure 12:
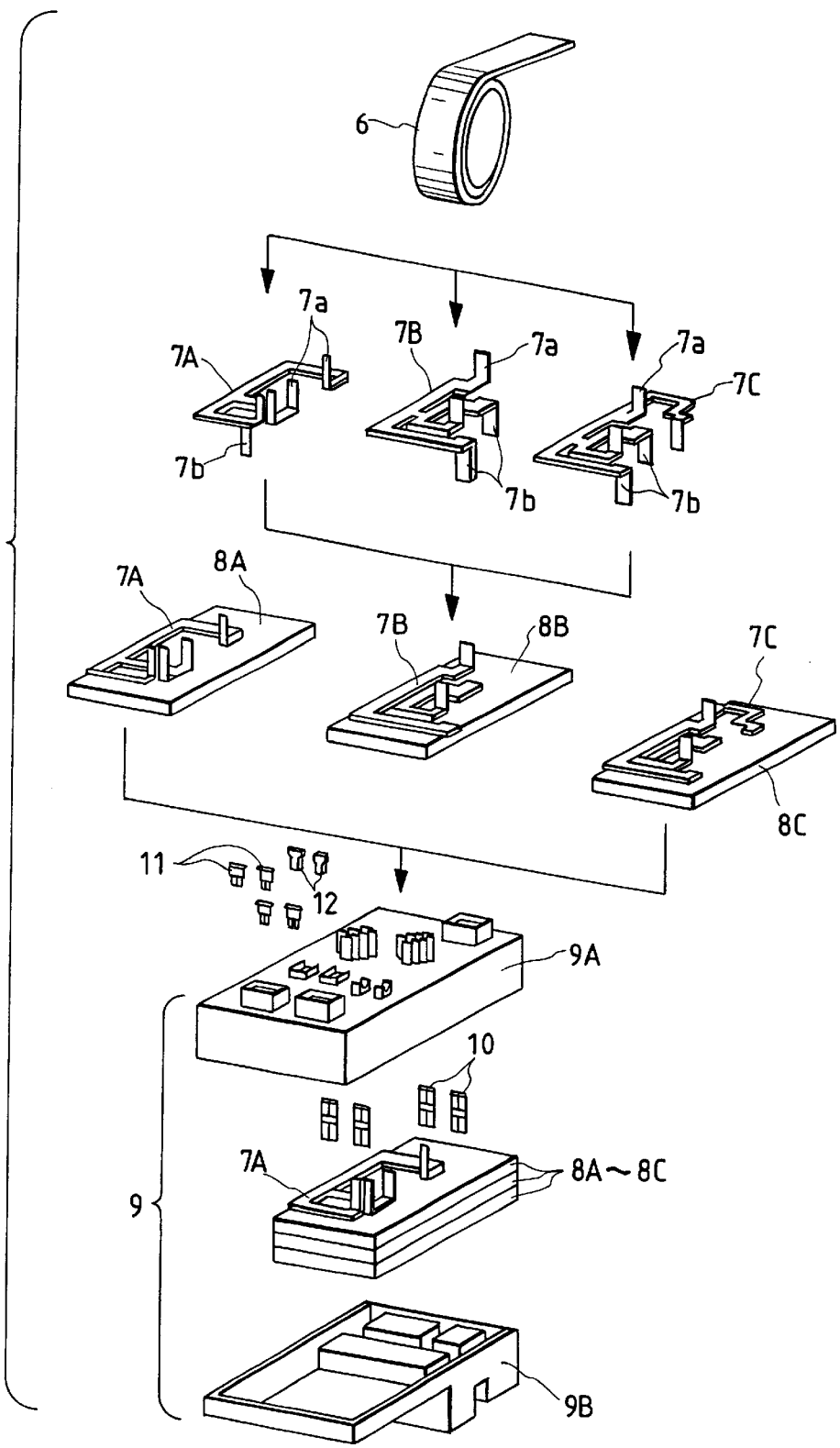
FIG. 12 is an exploded perspective view for briefly explaining the processing/assembling operations of the conventional bus bar.
Figure 13A:
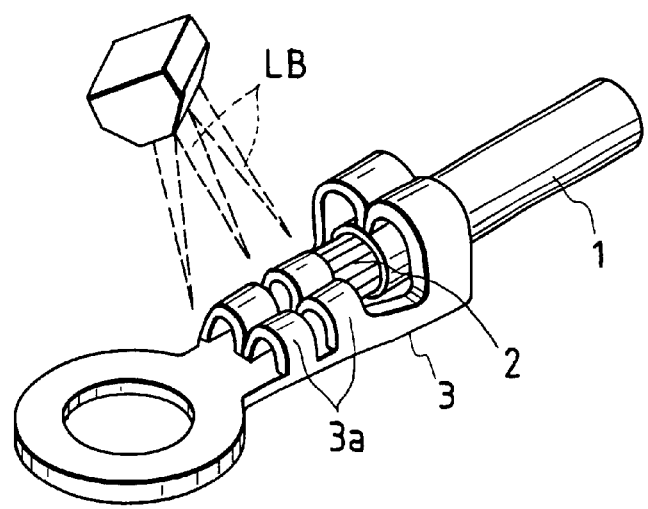
FIG. 13A and FIG. 13B are perspective views for showing the conventional laser welding such as the crimp-style terminal.
Figure 13B:
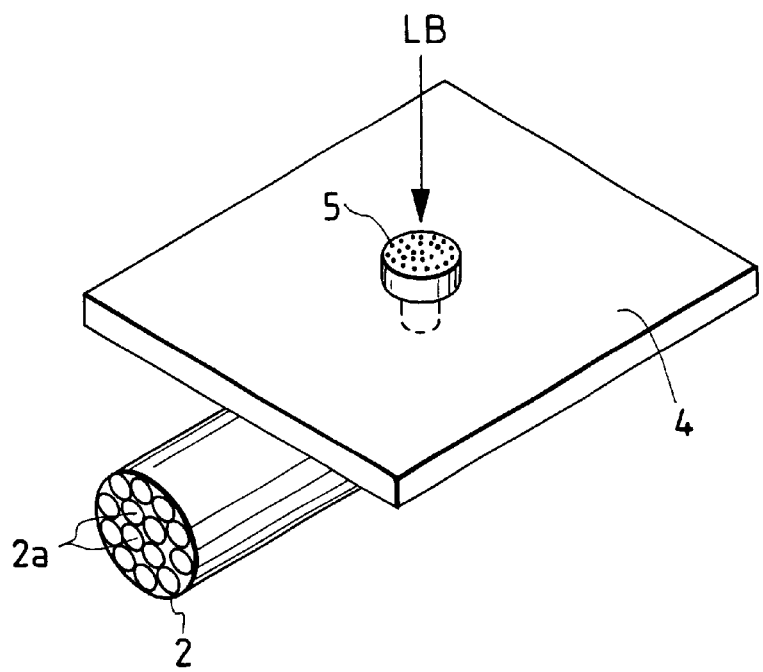

FIG. 10 shows a modification of the jumper 19, i.e., a tab terminal 19b is formed at a center position of the jumper 19 in an integral form.

As apparent from the foregoing descriptions, the bus bar structure according to the present invention is featured by that while the separately provided tab terminal abuts against the pattern portion of the bus bar, the pattern portion of the bus bar is welded with the tab terminal by using the laser beam.

As a consequence, no dead space used to cut/raise the tab terminal is longer required in the pattern portion of the bus bar. Since the pattern portions are additionally provided in this dead space, the resultant bus bar can be made compact and in high density, so that a total number of bus bar stacked layers can be reduced. As a result, a total number of the layers of the bus bars is reduced, and then a total quantity of press molds is decreased, which are used to stamp the bus bars from the hoop member and cut/raise the tab terminals. As a consequence, the cost of these press molds can be reduced, and also the electric junction box itself can be made compact, since the total number of the bus bar stacked layers is reduced.

When the junction terminal is formed on the tab terminal in an integral form, a separately provided junction terminal is not needed. As a result, a total number of components, or parts can be reduced.

Furthermore, in such a case that while the separately provided jumper abuts against the pattern portions of the bus bar in such a manner that this jumper sits astride on these pattern portions of this bus bar, the laser beam is irradiated onto these jumper and pattern portions of the bus bar, and then, these jumper and pattern portions are melted to be welded with each other, the patterns of the bus bars need not be connected to each other by using connectors. Therefore, both the cost saving and the space saving can be achieved.

Still further, in such a case that while the conductor such as FPC abuts against the pattern portion of the bus bar, the pattern portion of the bus bar is welded with the conductor, the conductor such as FPC is no longer connected to the pattern portion of the bus bar. As a result, both the space saving and the cost saving can be achieved.

Further, the present invention is featured by that after the fixing hole of the welding member is fitted into the boss portion of the board, and also the positioning hole of the member to be welded is fitted into the boss portion of the board, the tip portion of this boss portion is crushed, and the welding member is fixed on the board. At the same time, the member to be welded is positioned to the welding member. Thereafter, the welding member is welded with the member to be welded by using the laser beam. As a result, the member to be welded can be welded/fixed with the welding member under such a condition that this member to be welded can be positioned with respect to the welding member in high precision.

Also, the bus bar structure is constituted by welding the folded leg portion of the separately provided tab terminal with the pattern portion of the bus bar stored in the electric junction box by employing the laser beam. As a result, the separately provided tab terminal can be welded/fixed with the bus bar under such a condition that this tab terminal can be positioned with respect to the welding member in high precision.

Furthermore, the bus bar structure is constituted by welding the folded leg portion of the separately provided jumper with the pattern portion of the bus bar stored in the electric junction box by employing the laser beam. As a result, the separately provided jumper can be welded/fixed with the bus bar under such a condition that this tab terminal can be positioned with respect to the welding member in high precision.

What is claimed is:

1. A bus bar structure comprising:
   a bus bar stored in an electric junction box, said bus bar having a first hole;
   a connected body electrically connected to said bus bar, said connected body having a second hole; and
   a board arranging said bus bar and made of an insulating material, said board having a boss portion fitted to said first and second holes so as to position said bus bar and said connected body;
   wherein a tip portion of said boss portion is deformed so as to fix said bus bar and said connected body, after fitting said boss portion to said first and second holes, and said bus bar and said connected body positioned to each other are welded by using a laser beam.

2. A bus bar structure as claimed in claim 1, wherein said boss portion is fitted to said second hole after said boss portion is fitted to said first hole.

3. A bus bar structure as claimed in claim 1, wherein said boss portion is integrally formed with said board.

4. A bus bar structure as claimed in claim 1, wherein said connected body is a tab terminal, said board is made of synthetic resin, and a bent leg portion of said tab terminal is welded with a pattern portion of said bus bar by using the laser beam.

5. A bus bar structure as claimed in claim 1, wherein said connected body is a jumper disposed astride pattern portions of the bus bar, said board is made of synthetic resin, and a bent leg portion of said jumper is welded with each of the pattern portions of said bus bar by using the laser beam.

* * * * *